(12) United States Patent
Tassan et al.

(10) Patent No.: US 10,276,246 B2
(45) Date of Patent: Apr. 30, 2019

(54) METHOD AND APPARATUS FOR ENHANCING THE RELIABILITY OF A NON-VOLATILE MEMORY

(71) Applicant: HYPERSTONE GMBH, Constance (DE)

(72) Inventors: Fabio Tassan, Villasanta (IT); Jan Peter Berns, Constance (DE); Christoph Baumhof, Radolfzell (DE)

(73) Assignee: Hyperstone GmbH, Constance (DE)

( * ) Notice: Subject to any disclaimer, the term of this patent is extended or adjusted under 35 U.S.C. 154(b) by 0 days.

(21) Appl. No.: 15/701,205

(22) Filed: Sep. 11, 2017

(65) Prior Publication Data

US 2019/0035474 A1 Jan. 31, 2019

(30) Foreign Application Priority Data

Jul. 25, 2017 (DE) .................. 10 2017 212 767

(51) Int. Cl.
*G11C 16/10* (2006.01)
*G11C 29/12* (2006.01)

(52) U.S. Cl.
CPC ........ *G11C 16/105* (2013.01); *G11C 29/1201* (2013.01)

(58) Field of Classification Search
CPC ............. G11C 16/105; G11C 11/1068; G11C 13/0004; G11C 29/52; G11C 11/005; G11C 13/0033; G11C 29/50004; G11C 29/44; G11C 29/42; G11C 29/24; G11C 11/1048; G11C 2029/0407; G11C 2029/0411; G11C 7/04
See application file for complete search history.

(56) References Cited

U.S. PATENT DOCUMENTS 9,804,921 B2 * 10/2017 Suto .................... G06F 11/1048
2013/0124945 A1 5/2013 Hu et al.

* cited by examiner

*Primary Examiner* — David Lam
(74) *Attorney, Agent, or Firm* — HDC IP Law

(57) ABSTRACT

Various embodiments are related to non-volatile memories, systems, and methods of using such. Some instances provide a computer readable medium that includes instructions executable by one or more processors of an NVM controller for controlling a NVM using memory pages where the NVM controller having a predefined error correction coding, ECC, capability (ECCCTRL). Executing the instructions may cause the NVM controller to: perform a monitoring process and perform a transitioning process.

38 Claims, 8 Drawing Sheets

METHOD AND APPARATUS FOR ENHANCING THE RELIABILITY OF A NON-VOLATILE MEMORY

CROSS REFERENCE TO RELATED APPLICATIONS

The present application claims priority to German Patent Application No. 10 2017 212 767.8 entitled "Method And Apparatus For Enhancing The Reliability Of A Non-Volatile Memory", and filed Jul. 25, 2017. The entirety of the aforementioned reference is incorporated herein by reference for all purposes.

FIELD OF THE INVENTION

Embodiments are generally related to the field of non-volatility memory (NVM), such as flash memory. More specifically, various embodiments are directed to methods for implementing and using non-volatile memories, and in some cases to apparatus, computer programs, devices, and/or circuits for implementing the method as well as a memory system comprising an NVM and such NVM controller.

BACKGROUND

Nowadays, non-volatile digital information memory and particularly flash memory is found in many electronic devices, for example in communication technology and automotive technology. Non-volatile information memory is characterized by the fact that unlike volatile information memory, such as random access memory (RAM), it does not lose the data stored therein, if its power supply is discontinued. However, generally NVMs show some peculiarities that must be considered for their controlling by means of a NVM controller. Specifically, flash memories, particularly those of the NAND type, are important components in embedded systems as well as in consumer electronics.

The ongoing evolution of NVM technology continuously thrives for higher and higher memory densities, which, however, is in a natural conflict with the desired reliability of NVM devices, in particular with the desire to maintain or even lower the achievable bit error levels (BEL). It is desired to achieve increased memory densities while minimizing the impact on reliability. Hence, for at least the aforementioned reason, there exist a need in the art for enhanced methods and memory systems.

SUMMARY

Embodiments are generally related to the field of non-volatility memory (NVM), such as flash memory. More specifically, various embodiments are directed to methods for implementing and using non-volatile memories, and in some cases to apparatus, computer programs, devices, and/or circuits for implementing the method as well as a memory system comprising an NVM and such NVM controller.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
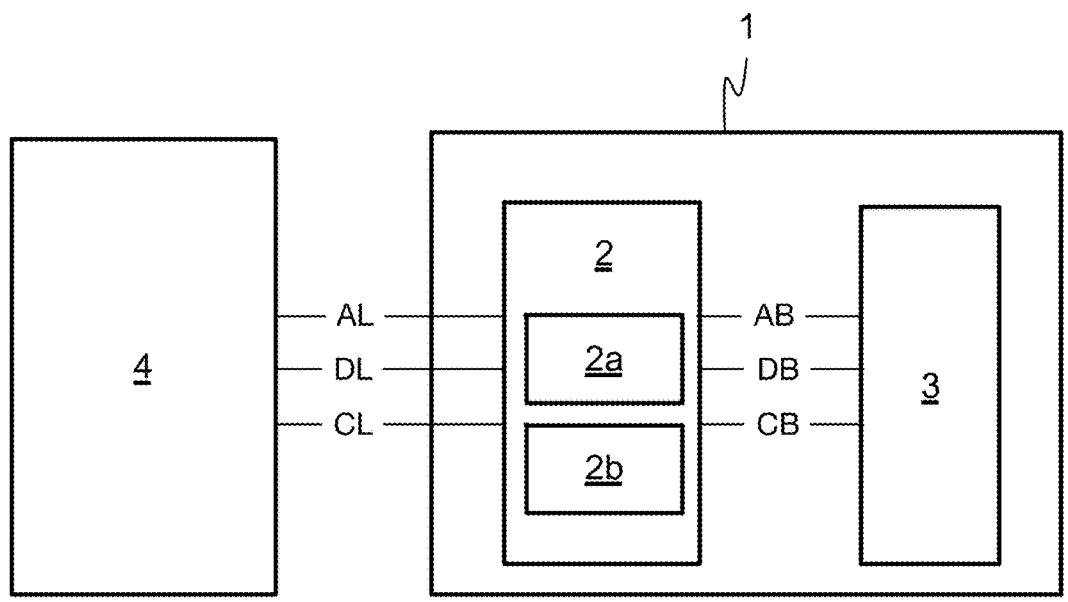
FIG. 1 shows a block diagram schematically illustrating a memory system including a NVM and a NVM controller, according to some embodiments of the present inventions.

Embodiments are generally related to the field of non-volatility memory (NVM), such as flash memory. More specifically, various embodiments are directed to methods for implementing and using non-volatile memories, and in some cases to apparatus, computer programs, devices, and/or circuits for implementing the method as well as a memory system comprising an NVM and such NVM controller.

One way for addressing reliability in a world of increasing memory densities is to use of error correction coding (ECC), wherein the data to be stored in NVM is coded into a plurality of separate codewords according to a predetermined coding scheme that involves adding redundancy in the form of one or more parity bits to the actual user data to be stored. A typical ECC scheme, that is particularly broadly used for flash memory devices, are the so-called Bose-Chaudhuri-Hocquenghem (BCH) codes. Typically, flash memories require ECC to ensure reliability, including particularly data integrity, for the user data.

In some cases, memory systems involving NVM comprise one or more NVM memory devices (and typically also one or more RAM memory devices) containing the actual memory cells in which data can be stored. In addition, such a system typically comprises one or more separate memory controller devices for controlling the set of memory devices of the system. When a new generation of NVM memory devices is introduced that require a higher ECC-level than the previous generation in order to achieve a comparable or even better reliability, the previous generation of memory controllers might not be capable of supporting such higher ECC-level, and accordingly also a respectively updated new generation of memory controller devices is typically required.

Particularly, so-called "3D" flash memories have significantly higher ECC requirements than previous 2D generations to reach their target reliability performance, i.e. significantly higher than an exemplary typical modern TLC flash device in 2D technology which normally requires 60b/1 KB ECC to reach 300 P/E cycles and 1 year of data retention. Moreover, the size of the spare area of modern 3D Flashes, which is needed to store the parity bits, is typically defined such that it corresponds to a high ECC code rate of around 0.9 or more, which is, however, not sufficient for supporting typically used ECC schemes, like for example the common BCH coding which can support such a high code rate only up to 64b/KB ECC. Thus, existing flash controllers for previous memory generations, such as 2D memory, will typically not meet such enhanced ECC requirements of the respective latest NVM technology generations.

In some cases, addressing this issue uses other ECC schemes supporting such high code rates, such as Low-Density-Parity-Check (LDPC) codes, which, however, due to the related increased processing effort involved typically goes along with negative impacts on read/write speed, energy consumption and other parameters.

During normal operation (read, program, erase) a flash memory experiences disturbs that cause the average number of error bits to increase and thus the flash memories reliability to decrease over lifetime. In particular, the number of P/E cycles and temperature may have a big impact on the reliability of a flash memory in terms of significantly reducing data retention (i.e. the ability to maintain stored data). When the flash memory device reaches, according to its specification and/or use case, the maximum bit error level al-lowed (ECCNVM), which may particularly be expressed in terms of the number of bits in a ECC codeword that are erroneous, (Error Bit Count, EBC), it has reached its end of life (EOL).

Some embodiments of the present inventions provide methods and apparatus for further enhancing the reliability of NVM memory, such as flash memory. In some particular cases, reliability of a non-volatile memory is enhanced under control of a corresponding NVM controller having a predefined error correction coding capability (ECCCTRL) being lower than or equal to the ECC-requirement (ECCNVM) of the NVM and using memory pages for storing data to the NVM.

In one or more embodiments of the present inventions, methods for enhancing the reliability of a non-volatile memory under control of a corresponding NVM controller are provided that have a predefined error correction coding capability being lower than or equal to the ECC-requirement of the NVM and using memory pages for storing data to the NVM. Such methods include a monitoring process which comprises the controller determining while applying a current mode of operation to a physical memory portion of the NVM corresponding to a specific memory page, whether a current operating condition of said memory portion is consistent with a corresponding predefined domain of operation in which the ECC capability of the controller matches or exceeds an actual bit error level of said memory portion. The method further comprises a transitioning process that includes: (i) if according to the determination made in the monitoring process the current operating condition of said memory portion has reached or passed a limit of said domain of operation, the controller transitions the NVM and/or itself at memory page level and with respect to operating said memory portion from the current mode of operation to a subsequent other mode of operation that involves a lower bit error level of the memory portion and/or a higher ECC capability of the controller than the current mode of operation, and (ii) else, continuing to apply the current mode of operation with respect to said memory portion.

As used herein, the term "reliability" is used in a broad sense to refer to the NVM's endurance, data retention capability, and/or data integrity. As used herein, the phrase "data integrity" is used in its broadest sense to refer to the maintenance of, and the assurance of the accuracy and consistency of, data over its entire life-cycle.

As used herein, the term "ECC-requirement" of an NVM is used in its broadest sense to refer to a defined ECC capability of an NVM controller to be used for controlling the NVM, which ECC capability is required by the NVM in order for it to achieve a specified target level of reliability. In some cases, this target level forms part of the technical specification of the respective NVM device.

As used herein, the phrase "memory page" or in short "page" is used it its broadest sense to refer to a set of NVM memory cells that are programmable as one unit. In some cases, without limitation, the set of memory cells is connected to a same wordline.

As used herein, the phrase "bit error level" (BEL) as used in its broadest sense to refer to a measure characterizing the actual number of bit errors occurring upon reading data stored in the NVM, specifically its memory portion corresponding to a particular memory page under consideration. As examples, but without limitation, the bit error level may be expressed as a bit error rate, such as the number of occurred bit errors per total bits read, or as an error bit count (EBC, also referred to as "fail bit count") referring to the number of occurred bit errors in an ECC codeword.

As used herein, the phrase "operating condition" of the NVM is used in its broadest sense to refer to a condition or state in which the NVM is currently operated and which may have an impact on the level of reliability, such as a BEL, the NVM can currently ensure. In some cases, the condition or state may be characterized by (i) an internal temperature of the NVM itself or to an external temperature to which it is exposed, or by (ii) a health state of the NVM, such as a wear level, the number of P/E cycles that have occurred during its lifetime so far, or a measured BEL.

As used herein, the phrase "domain of operation" is used in its broadest sent to refer to a predetermined range of operating conditions, such that if an operating condition of the NVM is consistent with the domain of operation, the ECC capability of the controller matches or exceeds an actual (e.g., measurable BEL of the considered memory portion, e.g., of the memory cells corresponding to a related memory page under consideration).

As used herein, the phrase "at memory page level" is used in its broadest sense to refer to selectively performing a corresponding method process at the level of a single memory page, such that different memory pages can be treated differently. In some cases, when the controller transitions the NVM and/or itself at memory page level and with respect to operating the memory portion corresponding to that specific page from the current mode of operation to a subsequent other mode of operation that involves a lower BEL of the memory portion and/or a higher ECC capability ECCCTRL of the controller than the current mode of operation, this means that specifically the mode of operation for that particular memory portion is changed while that of other memory portions relating to other pages may remain unaffected by the transition. Of course, this does not preclude the possibility of a simultaneous occurrence of multiple respective transitions, each relating to a different memory page.

In various instances of the aforementioned embodiments, the methods operate to ensure that despite the ECC capability of the controller being only lower than or equal to the ECC requirements of the NVM in the current mode of operation, the actual BEL does not exceed the corresponding ECC capability of the controller. When the actual BEL no longer falls into the predetermined operating domain one or more optimizations are initiated which bring down the BEL or increase the ECC capability of the controller such as to bring the operating condition back into the operating domain. In such instances, the methods enable the required level of reliability of the NVM during its whole operating lifetime (wherein EOL is reached when no further optimization is available any more and the limits of the operating domain have been reached or exceeded), because it provides that the actual BEL does not exceed the corresponding ECC capability of the controller. Thus, in comparison to a case without such optimizations, the EOL of that particular memory portion of the NVM (corresponding to the specific memory page considered) is delayed and thus its operating lifetime extended. Since the operating lifetime of the NVM as a whole depends on the operating lifetimes of its individual memory portions, also the EOL of the whole NVM may thus be delayed and accordingly the operating lifetime of the NVM thus be extended. Of course, other advantages are achieved by different instances of the aforementioned embodiments.

Other embodiments of the present inventions provide methods that include iteratively performing the processes described above until a predefined termination criterion is met. Accordingly, multiple transition processes, each initiating a further optimization, may be performed at different times, particularly in a staggered manner, whenever according to the monitoring process the operating condition has reached or passed the limit of the domain of operation. Thus, the lifetime of the NVM can be further extended until the termination criterion is met, which may particularly correspond to or indicate reaching the EOL of the NVM. The selection of a suitable termination criterion allows for adjusting the method and thus the resulting lifetime of the NVM according to specific needs in a given use case. In some cases, the termination criterion is defined based on at least one of the following: (i) the number of previous transition process; (ii) the availability of another subsequent mode of operation that involves a lower bit error level of the memory portion and/or a higher ECC capability of the controller than the current mode of operation; (iii) the number of program/erase cycles that have been previously performed on said memory portion. Specifically, two or more of these options may be combined. For example, option (ii) might be combined with option (iii) such that the method proceeds until the respective criterion of either option (ii) or option (iii) is met. Thus, EOL might be reached for example based on option (iii) although not (yet) based on option (ii), such that effectively option (iii) defines an additional layer of protection against unexpected data losses base on the number of P/E cycles.

In some instances of the aforementioned embodiments, the domain of operation is defined such that for any operating condition of said memory portion falling within the domain the ECC capability (ECCCTRL) of the controller exceeds the corresponding actual bit error level, BEL, of said memory portion by at least a predetermined corresponding distance. In this way a safety margin (such as a guard band) may be implemented which avoids that the method works exactly at the ECC limit of the controller. Thus, the reliability of a memory system implementing the method may be further enhanced.

In various instances of the aforementioned embodiments, the ECC capability of the controller and said domain of operation, and optionally also the ECC-requirement of the NVM, are each defined based on, in some cases in terms of, the number of error bits (fail bits) in a codeword of said ECC that can be corrected when ECC-decoding said codeword. Specifically, each of the ECC capability of the controller, the domain of operation and the ECC-requirement may be defined by a respective one-dimensional value representing a corresponding number of error bits in a codeword of said ECC, such that a comparison between these entities may be performed by simply comparing the respective values.

In one of more instances of the aforementioned embodiments, for ECC-decoding a codeword read from said memory portion, the current mode of operation of the controller applies a hard-decoding scheme, while the other mode of operation entered during the transition process applies a soft-decoding scheme based on reliability information about each bit of the codeword instead of or in addition to the hard-decoding scheme. Thus, hard decoding, which is typically simpler, faster and less resource intensive than soft-decoding, can be used as long as possible without compromising the condition of a desired level of reliability, while soft decoding, which provides improved ECC capabilities to the controller, is used instead or in addition, when it becomes necessary in order to continue fulfilling this condition. In various cases, the method according to this embodiment may further comprise initializing the soft-decoding scheme by performing a set of multiple reads of said memory portion at different predetermined read reference levels to derive reliability data for each of the bits of the memory portion and storing this reliability data for subsequent use by the soft decoding scheme. Without limitation, the reliability data may be stored in a dedicated memory area, particularly in the form of one or more so-called log-likelihood-ratio (LLR) tables. The reliability data represents for each bit an indication of the reliability of the respective bit, such that the read decoder can perform soft-decoding based thereon. Thus, the effectiveness of the soft decoding scheme can be optimized based on the actual physical memory portion to which it is to be applied thereafter.

In some instances of the aforementioned embodiments, the NVM is a flash memory of the m-level cell type, wherein m is a positive integer greater than 1, and the NVM supports simultaneous programming of k pages corresponding to said memory portion, with $1<k\leq m$, and the controller is a flash controller. In particular, m may be 2 (in which case the cells of the flash memory are usually referred to as Multi-level cells, MLC) or m may be 3 (in which case the cells of the flash memory are usually referred to as triple-level cells, TLC). As $m>1$, each wordline of the flash may correspond to m different pages. For example, in the case of MLC the two pages are typically referred to as "lower page" (LP) and "upper page" (UP). In the case of TLC, the additional middle page is typically referred to as "central page" or "center page" (CP). If the pages are not programmed simultaneously, it is the lowest page LP that is programmed first, followed by the CP (if applicable) and finally the UP. In one or more cases, the NVM is of the 3D-flash memory type. This type of memory typically has substantially higher ECC-requirements than conventional 2D flash memory generations and thus applying the method to 3D-flash memory may be particularly useful, esp. in view of the use of flash controllers originally designed for controlling 2D flash memory.

In various instances of the aforementioned embodiments when the NVM is of the flash type, the other mode of operation to be entered during the transition process involves for reading codewords from respective different pages of said memory portion, applying a set of read reference levels that differs with respect to at least one of said read reference levels from a corresponding set of read reference levels applied in the current mode of operation for reading codewords from the different pages of said memory portion. Furthermore, the transition process comprises repositioning said at least one read reference level such that the other mode of operation reduces the actual bit error level of the memory portion relative to the current mode of operation. Thus, this embodiment relates to one way of optimization, which may be performed as part of the transition process in order to reduce the bit error level of the flash memory and thus bring the operating condition of the flash memory back into the domain of operation or prevent it from leaving same in the first place. In some cases, the domain of operation is defined by means of a threshold for a corresponding BEL of said memory portion or a variable depending on BEL, one or more temperature thresholds for a temperature of said NVM, or a combination thereof. These can be advantageously used to reduce the complexity of an implementation of the method and/or to consider and address the impact of temperature levels or fluctuations on the reliability of flash memory devices.

In one or more instances of the aforementioned embodiments when the NVM is of the flash type, the other mode of operation to be entered during the transition process involves, for simultaneously programming two or more codewords in respective different pages of said memory portion, dividing each of the codewords in two or more sections and rearranging the sections such that for each codeword its different sections are spread across at least two of the pages being programmed. This embodiment provides another way of optimization, which may be performed as part of the transition process. It is particularly useful, if in a flash memory having $m>1$ levels, such as MLC or TLC flash, the BEL of the different pages corresponding to a same physical memory portion, such as the cells having a common wordline, is different. In such case this embodiment effectively provides an averaging of the BEL across all pages, such that the controller can now meet the flash memory's ECC-requirements even if could not without such averaging.

In some instances of the aforementioned embodiments when the NVM is of the flash type, the other mode of operation to be entered during the transition process involves controlling the NVM based on at least one operational parameter of the NVM having a different value than in the current mode. Furthermore, the transition process comprises setting the value of said at least one operational parameter to said different value, which is selected such as to reduce the actual bit error level of the memory portion when transitioning from the current mode of operation to the other mode of operation. In some cases, said at least one modified operational parameter is or affects one or more of the following parameters of the NVM or a combination of at least two thereof: (i) a programming voltage; (ii) a programming speed; (iii) a read voltage; (iv) an erase voltage; (v) an erase speed; (vi) one or more programming reference levels; (vii) a threshold voltage distribution across the cells of said memory portion. This embodiment provides yet another way of optimization, which may be performed as part of the transition process. In particular, the NVM controller may use an access to a test mode of the NVM in order to modify the at least one operational parameter of the NVM in a way that can reduce the BEL in order to maintain or bring back the operating conditions of the NVM into the domain of operation and thus ensure the desired reliability levels.

In one particular instance of the aforementioned embodiments, the domain of operation is divided into two or more distinct sub-domains corresponding to different ranges of reliability of the NVM. If according to the determination made in the monitoring process, the current operating condition of said memory portion falls within said domain of operation, the monitoring process further comprises determining among the sub-domains the specific sub-domain, into which the current operating condition falls. Said different value of the at least one operational parameter to be modified is determined based on the determination of said specific sub-domain, such that the extent of modification of said value during the transition process corresponds to the range of reliability pertaining to said specific determined sub-domain. This variant is particularly useful in cases, such as reducing a programming speed per option (ii) described above, where the optimization comes at a cost, such as a lower programming throughput. Then the at least one operational parameter can be specifically set such as to obtain an optimal compromise between the necessary parameter adjustment to safeguard the desired reliability level on the one hand and the minimizing of an undesired cost of such an adjustment on the other hand.

In one or more instances of the aforementioned embodiments when the NVM is of the flash type, the other mode of operation to be entered during the transition process involves applying different ECC levels for programming different pages corresponding to said memory portion. Particularly, a higher ECC level may be applied to a higher-level page (e.g. UP or CP), while a lower ECC level may be applied to a lower-level page (e.g. LP) corresponding to said memory portion. This embodiment provides yet another way of optimization, which may be performed as part of the transition process. It is particularly useful in situations, where several pages corresponding to a same memory portion are programmed simultaneously and the BEL of these different pages would differ significantly without such optimization. As different ECC-levels typically have different encoding and decoding speeds (and thus programming and reading speeds), this embodiment can be used to optimize the respective operational speed (esp. reading speed) without compromising the desired level of reliability, while optimizing the lifetime of the NVM. In some cases, programming said higher-level page comprises storing a subset of (one or more of) the parity bits required for programming the ECC codewords of said higher ECC-level into an unused portion of a spare area allocated to said lower-level page. Thus, for at least said higher page, an ECC-level requiring more spare area than is actually allocated to that higher page may be used, which increases the degree of optimization, e.g. in terms of a reduction of the BEL, that is achievable.

Yet further embodiments of the present inventions are directed to a computer program comprising instructions, which when executed on one or more processors of an NVM controller for controlling a NVM using memory pages, the controller having a predefined error correction coding, ECC, capability. The computer program product may particularly be provided in the form of a non-transient data medium on which one or more programs for executing the method are stored. In some cases, this is a data carrier, such as an optical data carrier (e.g. CD, DVD etc.) or a flash memory module. This can be particularly advantageous if the computer program product is tradable as such or can be used by the user of the memory controller or memory system itself for programming same. Alternatively, or additionally, the computer program may also be loadable as a file on a data processing unit, in particular on a server, and via a data link into the memory controller or an external memory allocated to it (e.g. via download via the Internet or a dedicated data connection).

Additional embodiments of the present inventions are directed to NVM controllers for controlling a NVM, such as a flash memory, using memory pages, the controller having a predefined error correction coding, ECC, capability and being configured to perform one or more of the methods discussed above. Specifically, the NVM controller may be implemented as a separate device, e.g. an integrated circuit (IC) device, or be incorporated into another device, such as an IC having also additional functionality or even in a NVM device itself.

In some cases, the NVM controller may comprise one or more processors and a computer program according one or more of the embodiments discussed above, the computer program being stored in a programmable non-volatile memory and being configured to be executed on the one or more processors and to cause the controller to perform the methods discussed above. In this way, the NVM controller is configurable by modifying the computer program, which particularly allows for updating, correcting or enhancing the ECC capabilities of the NVM controller on software level while still the same hardware (e.g. controller IC) may be used. Yet additional embodiments of the present inventions are directed to a memory system comprising: an NVM, such as flash memory, and the NVM controller of one of the embodiments discussed above.

FIG. 1 shows an exemplary NVM based memory system 1 comprising a NVM controller 2 and a NVM device 3, which may particularly be a flash memory device, e.g. of the NAND type. The memory system 1 is connected to a host 4, such as a computer to which the memory system 1 pertains, via a set of address lines AL, a set of data lines DL and set of control lines CL. The memory controller 2 comprises a processing unit 2a and an internal memory 2b, typically of the embedded type, and is connected to the memory 3 via an ad-dress bus AB, a data bus DB, and a control bus CB. Accordingly, host 4 has indirect read and/or write access to the memory 3 via its connections AL, DL and CL to the memory controller 2, which in turn can directly access the memory 3 via the buses AB, DB and CB. Each of the set of lines respectively buses AL, DL, CL, AB, DB and CB may be implemented by one or more individual communication lines. Bus AB may also be absent.

The NVM controller 2 is adapted to perform the decoding methods of the present invention, particularly as described below with reference to FIGS. 2A to 9. To that purpose, the NVM controller 2 may comprise a computer program residing in its internal memory 2b which is configured to perform one or more of these methods when executed on the processing unit 2a of the NVM controller 2. Alternatively, the program may for example reside, in whole or in part, in memory device 3 or in an additional program memory (not shown) or may even be implemented in whole or part by a hard-wired circuit.

Figure 2A:
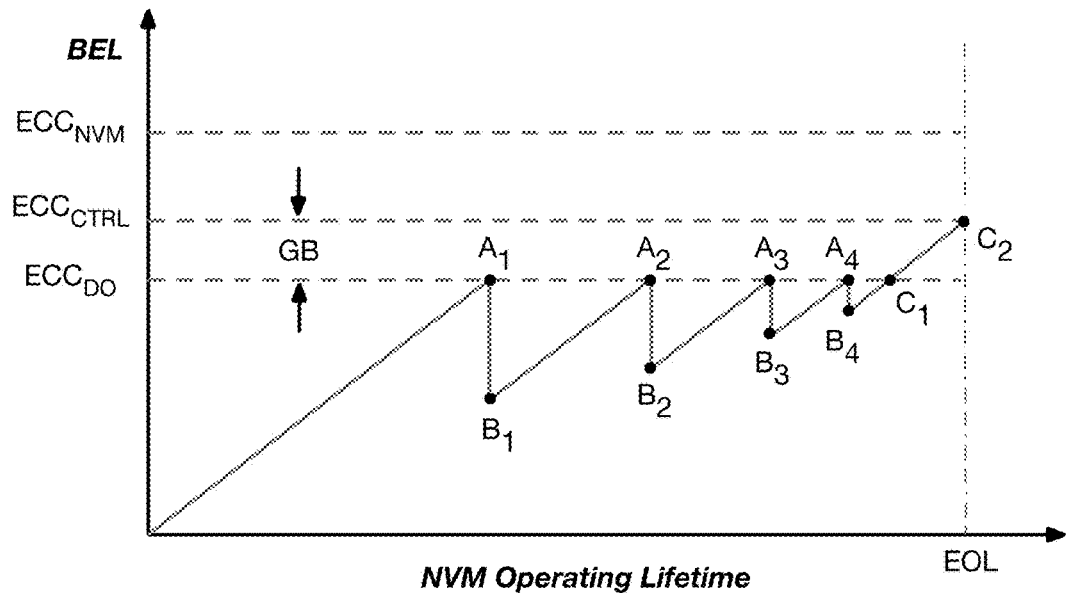
FIGS. 2A and 2B schematically illustrate variants of a basic scheme of a method of enhancing the reliability and the operating lifetime of a NVM, according to various embodiments of the present inventions.

FIG. 2A shows a diagram for illustrating an exemplary temporal change of a Bit Error Level (BEL) of an NVM memory device being controlled by a corresponding NVM controller according to an embodiment of the present invention. The NVM uses memory pages for storing data to the NVM, which may particularly be of the flash memory type. For ex-ample, the NVM may be of the single level cell (SLC) flash type, multilevel cell (MLC) flash type or triple level cell (TLC) flash type. However, other forms of NVM, such as magneto-resistive RAM (MRAM) or ferroelectric RAM (FRAM), may be used as well.

While in principle, a BEL may be defined for a whole memory device, in the following BEL is defined relative to a specific memory portion of the NVM and the methods presented below are described in relation to such a memory portion rather than the NVM as a whole, unless explicitly stated otherwise. For example, the BEL may be defined in terms of an error bit count (EBC), i.e. the number of bit errors occurring in an ECC codeword covering all bits of a specific page corresponding to the memory portion. In some cases, the memory portion comprises all the memory cells of the NVM pertaining to a respective same word line.

The diagram of FIG. 2A shows three different BEL thresholds in dashed lines. The top threshold ECCNVM represents the ECC requirements of the NVM, i.e. the minimum ECC capability of the corresponding NVM controller that is necessary to ensure the required reliability of the NVM, if no further measures for keeping the BEL lower than ECCNVM are taken. Accordingly, in conventional NVM memory systems, the second threshold ECCCTRL, which represents the ECC capability of the NVM controller, is selected such that it matches or even exceeds ECCNVM. According to the present invention, however, ECCCTRL may be selected to be lower than ECCNVM, because, as will be explained in more detail below, certain measures are taken to keep the actual BEL of the NVM below or at maxi-mum at ECCCTRL. In the example of FIG. 2A, an additional security margin in the form of a guard band GB is provided, which defines an extra distance between ECCCTRL and a third threshold ECCDO defined below ECCCTRL. In the diagram, the area that is limited by the two axes, in the BEL-dimension by ECCDO on the top, and by the EOL point at the right on the time dimension, is referred to as domain of operation DO of the NVM, i.e. a domain covering those potential operating conditions of the NVM for which the reliability requirements of the NVM can be met based on the given values for ECCNVM, ECCCTRL and ECCDO. If instead, according to another embodiment, no guard band GB is used, ECCDO is equal to ECCCTRL.

At the beginning of its lifetime, the NVM memory device has its minimum BEL, which may or may not be above zero.

Over time, and particularly along with an increasing number of P/E cycles, the BEL increases. During this evolution, the controller performs a monitoring wherein it determines while applying an initial mode of operation to a physical memory portion of the NVM corresponding to a specific memory page, whether the current operating condition of said memory portion, which in this example is the current BEL expressed in terms of EBC for the ECC codewords corresponding to said memory page, has reached or passed the threshold ECCDO that defines a limit of the DO. Accordingly, when the curve in FIG. 2A reaches point A1, the controller recognizes that the operating condition is about to leave the DO. In order to avoid this, the controller triggers a transition of the NVM and/or itself at memory page level and with respect to operating said memory portion from the current initial mode of operation to a subsequent other mode of operation that involves a lower BEL of the memory portion than the current mode of operation. Accordingly, the curve drops two point B1 representing said lower BEL. Thereafter, the BEL increases again over time until it reaches again the limit ECCDO of the DO at a point A2. Here, the controller triggers a further transition to yet another mode of operation, which again reduces the BEL of the NVM down to a level indicated by point B2. This process can be continued iteratively involving points A3, B3, A4 and B4 until a termination criterion is met that defines an end of the iteration. Specifically, when after triggering, at point A4, a transition to a last remaining operating mode, the operating condition drops to point B4, and then increases again and thereby reaches again the limit ECCDO of the DO at a point C1, reaching C1 may be defined as the termination criterion. In the alternative (as illustrated in FIG. 2A), reaching the point C2 at the level of ECCCTRL (or in yet another alternative, any specific predefined point between C1 and C2) may be defined as the termination criterion which ends the iteration and at the same time defines EOL of the memory portion under consideration. As illustrated in FIG. 2A, this method ensures that despite ECCCTRL being lower than ECCNVM the BEL never exceeds ECCCTRL and thus the reliability of the NVM is not compromised, until finally, EOL is reached. This enables the use of an NVM controller in connection with an NVM where ECCCTRL<ECCNVM. Furthermore, EOL of the memory portion and thus eventually of the NVM as a whole may be significantly delayed, i.e. the total operating lifetime of the NVM significantly extended.

Figure 2B:
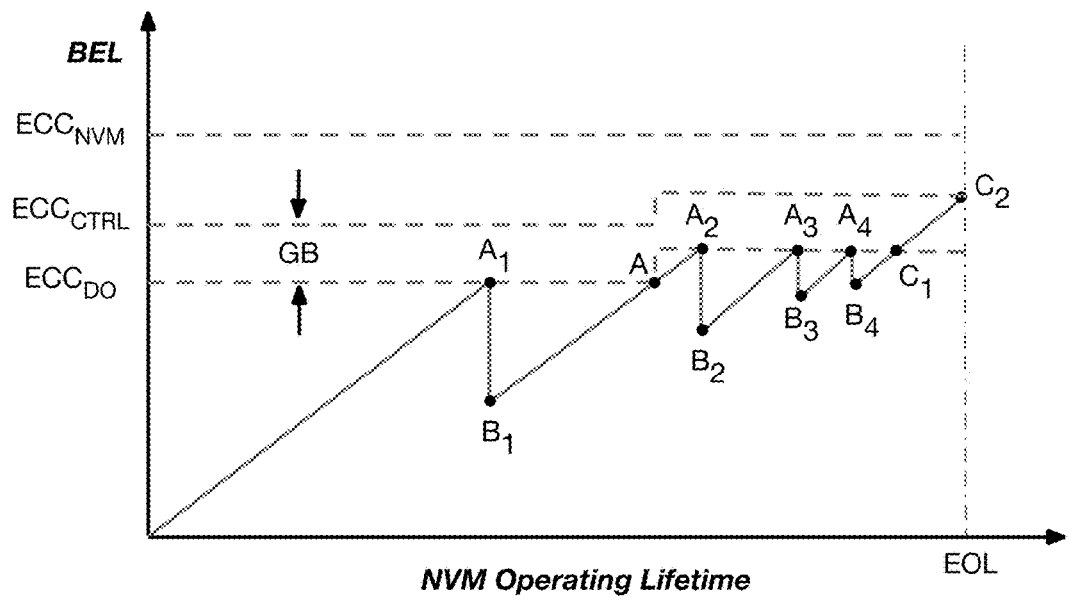

FIG. 2B illustrates another variant of the method which is similar to that of FIG. 2A, except that when the operating condition after dropping to point B1 increases again up to a point A at the level of ECCDO, the mode of operation triggered at that point does not necessarily have to reduce the BEL but may instead (as illustrated in FIG. 2B) or in addition cause the NVM to transition itself into a mode of operation with an increased ECCCTRL and thus also increased ECCDO. This might particularly be achieved by activating a more powerful ECC decoding algorithm, such as transitioning from hard decoding to soft decoding. Thus, the operating condition may further increase until point A2, where it reaches the new ECCDO limit of the DO. The subsequent iterations process, if any, may then again be similar to those in FIG. 2A. It is noted, that while for the sake of illustration and avoiding unnecessary complexity, in both FIGS. 2A and 2B, only linear curves respectively linear sections thereof are used to illustrated the time wise evolution of BEL during the operating lifetime of the NVM, there is in fact no linearity requirement for these curves respectively individual sections thereof and the curve may vary from NVM device to NVM device and may even be different for different pages and memory sections of a given NVM device. With the aging of the NVM, such as flash memory, and particularly the number of performed P/E cycles, the amount of error bits that can be recovered at all by ECC decoding is typically reduced due to the physical damage caused to the cells by the P/E operations performed on the NVM cells. Accordingly, at some point even initiating further optimizations, such as advanced ECC capabilities ECCCTRL, will no longer be able to keep the BEL within the de-sired domain of operation and thus EOL will eventually be reached.

Figure 3:
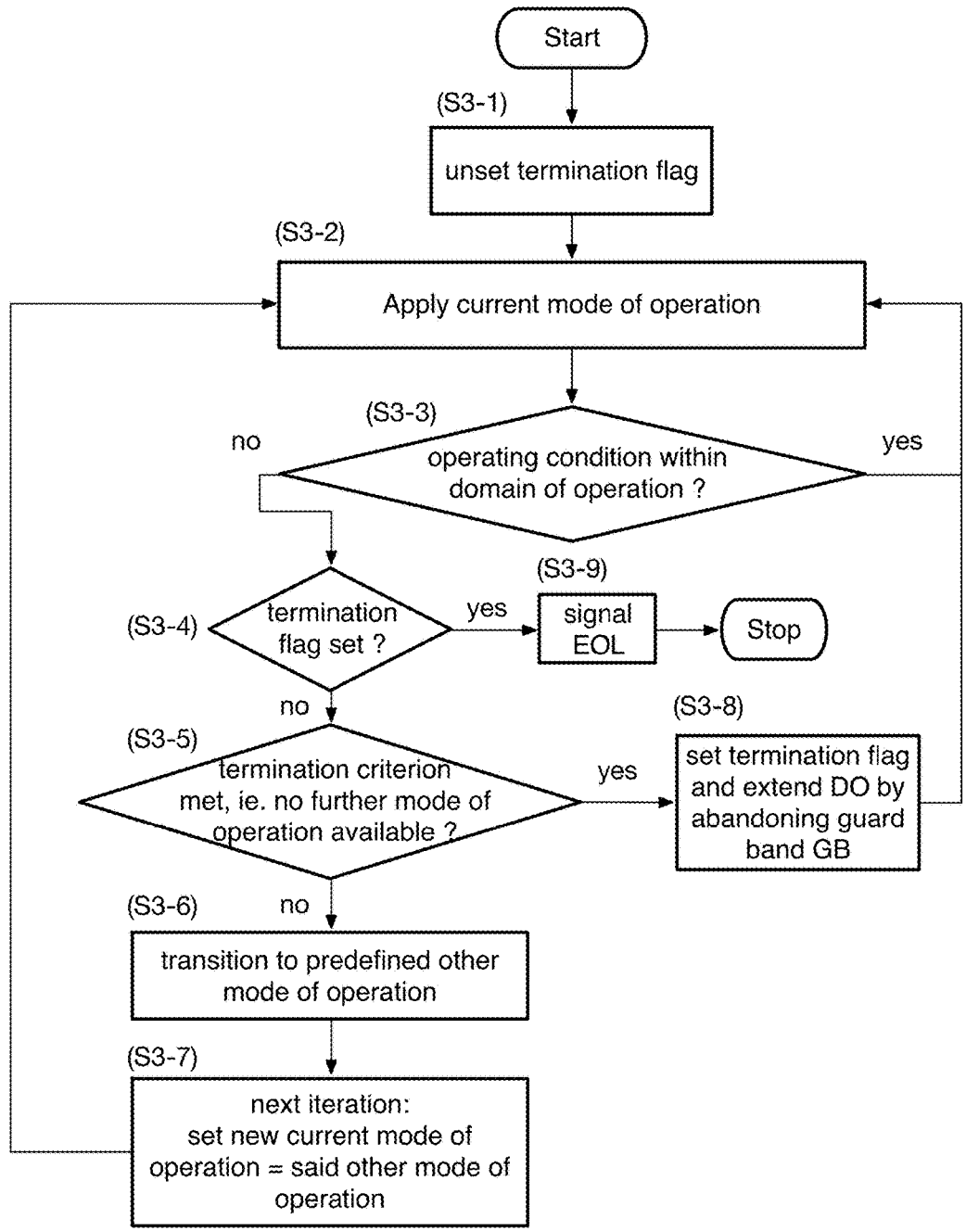
FIG. 3 is a flow chart illustrating an exemplary embodiment of the methods of FIGS. 2A and 2B.

FIG. 3 is a flow chart illustrating an exemplary embodiment of the general methods of FIGS. 2A and 2B. In particular, the method of FIG. 3 is configured to support multiple iterations corresponding to multiple trigger points A1, A2 etc. as illustrated in FIGS. 2A and 2B until a termination criterion is met. In initial process S3-1 and S3-2, the method, respectively the NVM controller performing it, is initialized. Thereby, an indicator, such as a termination flag, is initialized in process S3-1 in such a way that it indicates that further iterations are available and no termination is imminent. In the example presented in FIG. 3, this indicator is defined as a single bit termination flag which is unset, e.g. set to be "0". In process S3-2, a current mode of operation is applied by the NVM controller to interact with the NVM, wherein, initially, the current mode is an initial mode of operation that is applied before any further iterations occur. Typically, the initial mode of operation corresponds to a basic mode of operation, where the NVM applies a basic ECC scheme that is not yet further enhanced by one or more of the optimizations described herein, particularly with respect to the subsequent FIGS. 4 to 9. In FIGS. 2A and 2B, the initial mode is applied during the time frame starting at the beginning of the operating lifetime and ending at point A1.

While the current mode of operation is being applied according to process S3-2, a current operating condition of the NVM, e.g. its current BEL, is measured and a determination is made in a monitoring process S3-3, whether the measured operating condition falls within a predetermined domain of operation DO, i.e. in the case of FIGS. 2A and 2B, whether the measured BEL is lower than ECCDO. If this is the case (S3-3, yes), then the method branches back and continues to apply the current mode of operation according to process S3-2.

Otherwise (S3-3, no), in a subsequent process S3-4, it is determined whether the termination flag is set (i.e. set to "1" in the present example), thus indicating an imminent termination, or still has its initial status of being "unset" (i.e. is set to "0" in the present example). If the termination flag is unset (S3-4, no), which corresponds to reaching, for the considered specific memory portion/page, one of points A1 to A4 or C1 in FIG. 2A respectively FIG. 2B, in a further process S3-5 a determination is made, as to whether a termination criterion is met. In the specific example of FIG. 3 this criterion is defined by whether a further mode of operation that has not been initiated yet is still available. If the termination criterion is not met (S3-5, no), the method proceeds to a further process S3-6 (transition process), wherein a transition to a predefined other mode of operation is performed, i.e. an optimization is initiated, which reduces the BEL and/or increases ECCCTRL and consequently ECCDO, as illustrated in FIG. 2A and FIG. 2B, respectively. Here, process S3-6 corresponds to a transition from a respective point Ai to a corresponding point Bi, with i=1, . . . , 4. Then, in process S3-7, which may also coincide with process S3-6, the next iteration is initiated by setting the new current mode of operation to be said other mode of operation to which the transition ac-cording to process S3-6 has been made. Then, the method branches back to process S3-2, where this new current mode of operation is applied during said next iteration.

If, on the other hand, in process S3-5 a determination is made that the termination criterion is met (S3-5, yes), i.e. that in the present example no further mode of operation is available (cf. point C1 in FIGS. 2A, 2B), the method branches to a further process S3-8, in which the termination flag is set (the present example to "1") and the domain of operation DO is extended by abandoning the guard band GB, such that the upper limit of the DO is now de-fined by ECCCTRL. Then, the method branches back to process S3-2, where application of the current mode of operation is continued. When subsequently in process S3-3 a determination is made that the BEL of the memory portion has again reached the (new) limit of the DO (S3-3, no), which corresponds to reaching point C2 in FIGS. 2A and 2B, respectively, and accordingly, in process S3-4 a determination is made that the termination flag is set (S3-4, yes), the method branches to a further process S3-9. At that process S3-9 EOL is determined and signaled, e.g. by setting a respective further flag, and the method terminates. The extension of the DO at point C1 allows for a further extension of the operating lifetime of the considered memory portion and may also be used to extend the operating lifetime of the NVM as a whole, e.g. if EOL of an NVM device as a whole is determined on the basis of the percentage of its memory portions (or corresponding pages) having individually reached their respective EOL.

Figure 4:
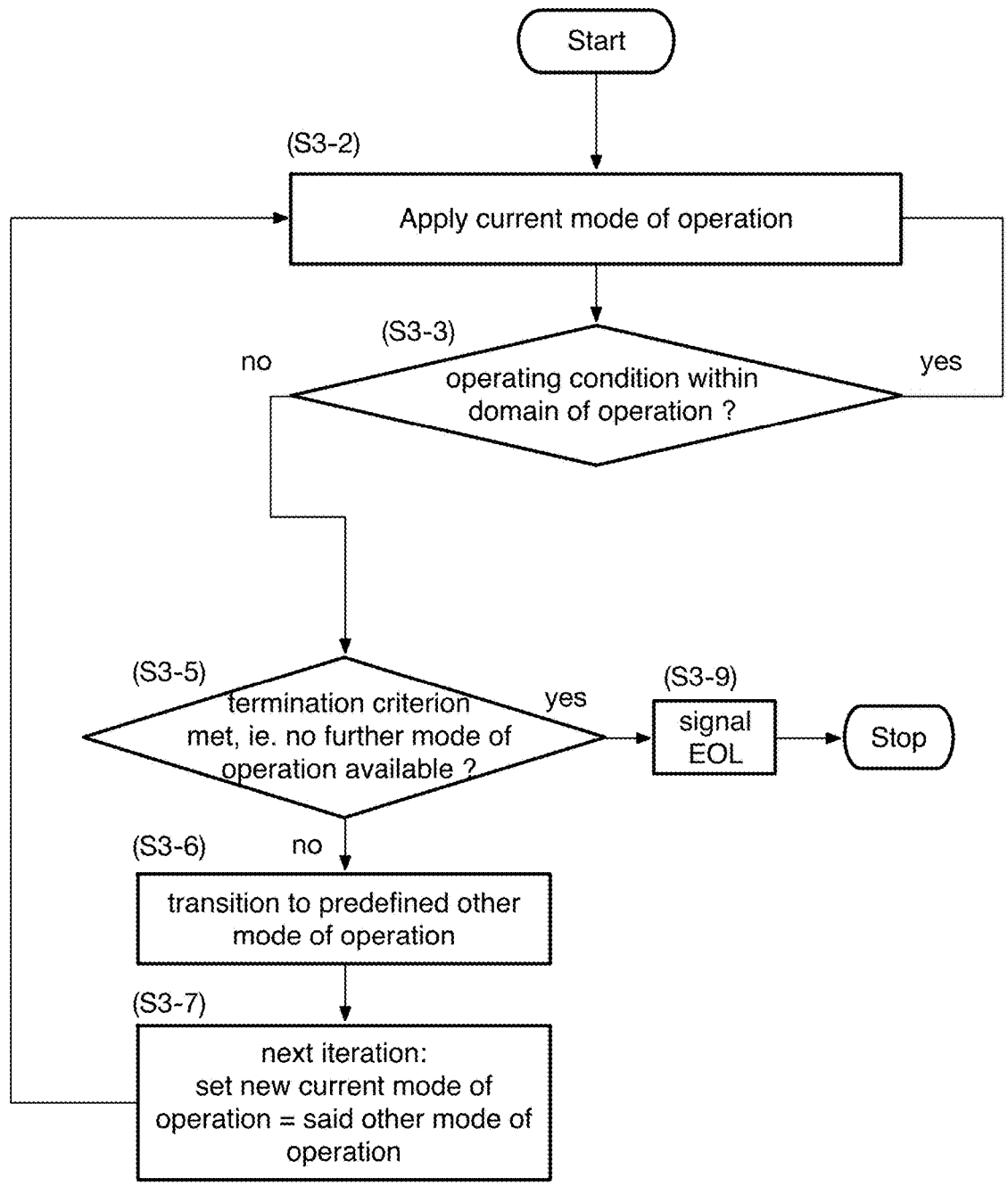
FIG. 4 illustrates a variant of the method of FIG. 3.

FIG. 4 illustrates a simplified variant of the method of FIG. 3, where process S3-9 is immediately initiated when according to the determination made in process S3-5 the termination criteria is met (S3-5, yes). Accordingly, EOL is determined already at point C1 in FIGS. 2A and 2B, respectively, and processes S3-1, S3-4 and S3-8 are obsolete. According to this variant, the additional protection provided by the guard band GB is maintained all the way up to EOL.

Figure 5:
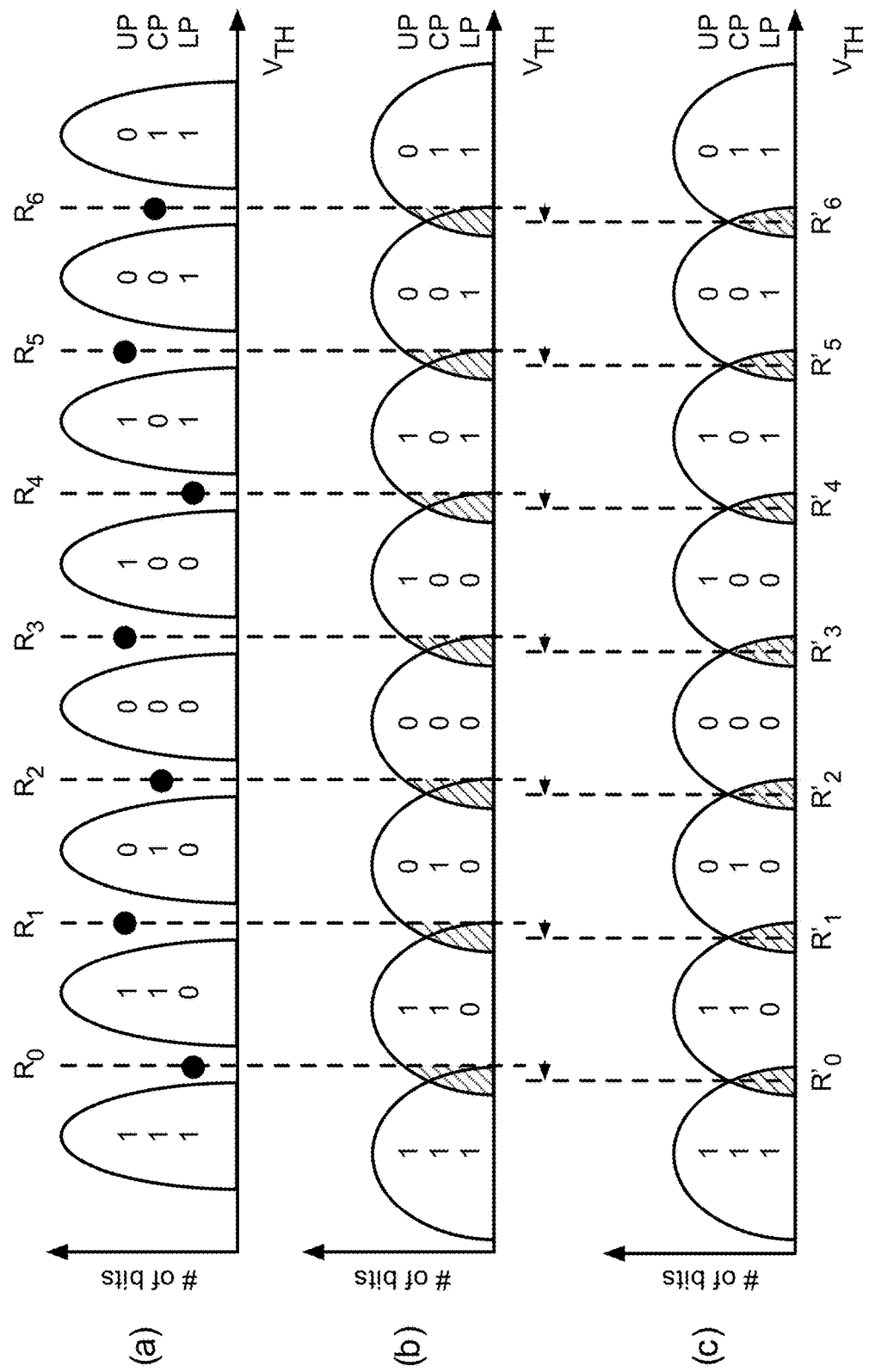
FIG. 5 is an illustration of threshold voltage (VTH) distributions and different sets of read reference levels of an exemplary NVM implemented as a TLC flash memory, according to one or more embodiments of the present inventions.

FIG. 5 is an illustration of threshold voltage (VTH) distributions and different sets of read reference levels of an exemplary NVM implemented as a TLC flash memory cell, according to an embodiment of the present invention. Particularly, FIG. 5 refers to one possible optimization and mode of operation that may be initiated in the transition process, such as process S3-6 in FIGS. 3 and 4. Specifically, FIG. 5 illustrates the $2^3=8$ different cell states and thus possible bit combinations each individual cell in the TLC flash may assume, if programmed accordingly. For example, but without limitation, an erased state may correspond to the VTH values below a first threshold R0 and the bit combination 111 may be assigned to it. Furthermore, the bit combination 011 may be assigned to the cell state having VTH values above a sixth threshold R6. The other states in-between correspond to respective VTH ranges each being defined by its respective limiting lower and upper thresholds Ri respectively Ri+1, with i=0 to 5, and having a respective bit combination assigned to it. The assignment of specific bit combinations to the various cell states may in principle be defined arbitrarily, although some assignments may be more better than others, such that FIG. 5 only illustrates a specific example, without limitation. Logically, the three bits represented by each cell may be allocated to different memory pages. For example, as illustrated in FIG. 5, the first bit may be allocated to a so-called upper page (UP), the second bit to a so-called central (or center) page CP, and the third bit to a so-called lower page LP. If the NVM and/or the NVM controller is configured such that the pages may be programmed one after another (instead of simultaneously), typically the lower page LP is defined as the page which is programmed at first, the center page CP being the second page to be programmed and the upper page UP being the final page to be programmed.

In addition, FIG. 5 shows, for each of the eight different states, a typical distribution of the number of bits per VTH of a memory portion thereof that corresponds to the LP, CP and UP pages, wherein a logarithmic scale is used. Particularly, such memory portion will typically comprise all the cells of a specific wordline of the TLC flash. In other words, when all or a subset of the cells of the memory portion are programmed to assume one of the eight cell states and represent a corresponding bit combination, in the real world not all of the bits actually end up having the same VTH, but rather a certain distribution of the number of cell respectively bits across the VTH axis will occur. Typically, this distribution will be similar to a Gaussian function, which corresponds to an inverted parabola on a logarithmic number of bits-scale, as shown in FIG. 5.

Specifically, FIG. 5 (a) shows an ideal situation, where each of the distributions, each corresponding to a particular bit combination, remains entirely within its respective VTH range, as defined by the read reference levels R0 through R6. Accordingly, when reading the respective page or pages by comparing the detected VTH of the read cells with the relevant subset of read reference levels R0 to R6, no error bits will occur, i.e. the error bit count (EBC) for the ECC codewords of a respective page will be zero.

However, over the operating lifetime of the memory the EBC tends to increase due to many effects, such as read and program disturbs, P/E cycles and limited data retention. FIG. 5 (b) illustrates such a situation, which involves a shifting and potentially shape changes of the respective distributions. Now, some or all of the distributions may extend beyond the limits defined by its respective lower and upper read reference levels Ri and Ri+1, with i=0, . . . , 5, into a neighboring range, such as the respective lower range as illustrated in FIG. 5 (b). Accordingly, the area below the respective distribution curve that falls within the neighboring range (cf. shaded areas in FIG. 5) corresponds to the number of bits respectively cells within the memory portion that will likely cause respective bit errors during reading of the cells respectively its corresponding pages. Accordingly, over time the BEL, e.g. expressed in terms of EBC, will increase, as indicated in each of FIGS. 2A and 2B. In a TLC flash device, this phenomena effects, usually with different severity, all of the eight states that define the three bits of information of each cell.

FIG. 5 (c) illustrates a mode of operation, which may be initiated at said transition process (cf. process 3-6 in FIGS. 3 and 4) that involves repositioning one or more, typically all, of the read reference levels R0 to R6 along the VTH axis such as to minimize the BEL. Particularly, for such repositioning, the resulting set of new read reference levels R'0 to R'6 may be selected such, that they each cut the respective shaded area, at least approximately, in half, which is particularly optimal, if the distributions of neighboring bit combinations are substantially similar such that positioning the new read reference levels half way between the two neighboring distributions approaches or even exactly hit a point of minimal BEL, e.g. expressed as EBC. After such optimization, the resulting reduced BEL (corresponding to a respective point Bi, with i=1 to 4, in FIGS. 2A and 2B) falls again into and thus is again consistent with the domain of operation DO.

Figure 6:
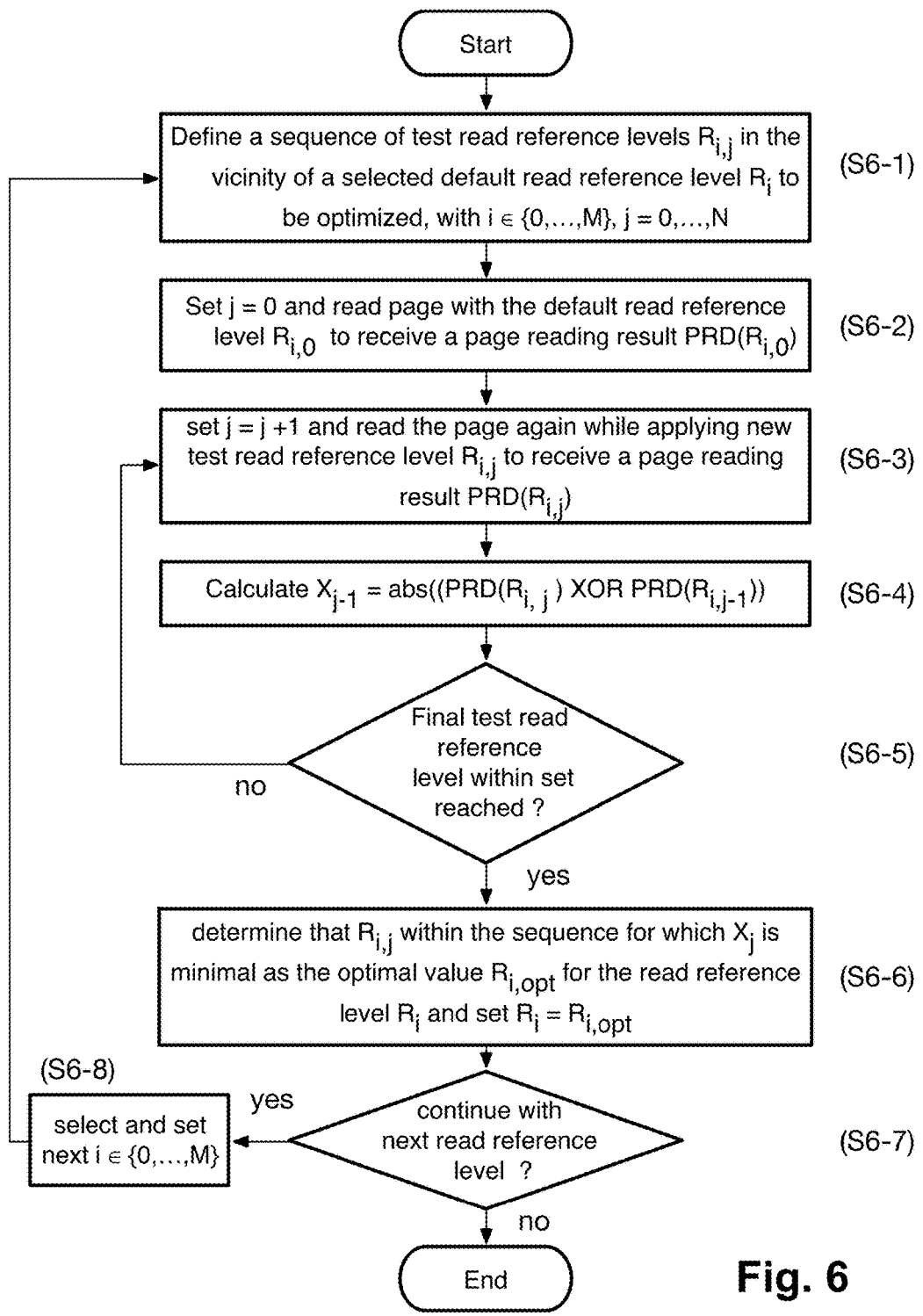
FIG. 6 is a flow chart illustrating an extension that may be applied to any one of the methods of FIGS. 2A to 5 in the form of an additive initialization method, according to various embodiments of the present inventions.

FIG. 6 is a flow chart illustrating a related exemplary method of determining an optimal set of read reference levels for the mode of operation illustrated in FIG. 5. In particular, the method of FIG. 6 may be performed briefly or immediately before the transition process (cf. process 3-6 in FIGS. 3, 4) at which mode of operation of FIG. 5 (c) is initiated. The new optimal set of read reference levels can be found by using dedicated flash commands or directly by the controller through multiple readings of the same page using different test read reference level settings.

In a process S6-1, a sequence of test read reference levels Ri,j is defined in the vicinity of a selected default read reference level Ri from the set of M+1 read reference levels to be optimized, with i∈{0, . . . , M}; j=0, . . . , N; Ri,0=Ri; and M, N being positive integers, wherein N+1 is the number of test reads being applied. In a further process S6-2, the memory page, with respect to which one or more of the read reference levels are to be optimized, is read using the default read reference level Ri,0, (i.e. j is set to 0) as a first test read reference level and yielding a page reading result PRD(Ri,0). In a further process S6-3, j is incremented and the same memory page is read again wherein the next test read reference level Ri,j of the sequence is applied to receive a page reading result PRD(Ri,j).

Then, in a process S6-4, the absolute value Xj−1=abs ((PRD(Ri, j) XOR PRD(Ri,j−1)) resulting from performing the Boolean exclusive or (XOR) operation on the two reading results PRD(Ri,j) and PRD(Ri,j−1) is calculated. If according to a determination made in a further process S6-5, the current test read reference level Ri,j does not correspond to the final test read reference level of the sequence (S6-5, no), the method branches back to process S6-3 for a further iteration using another test read reference level. Otherwise (S6-5, yes), i.e. when all test reference levels defined in the sequence have been tested, the further process S6-6 that test reference level Ri,j within the sequence, for which the corresponding calculated value Xj is minimal, is determined as the optimal value Ri,opt for the read reference level Ri and therefore Ri is replaced by its optimal value R'i=Ri,opt. Thereafter, if the value of a further read reference level needs to be optimized (process S6-7, yes), this further read reference level or index i∈{0, . . . , M} is selected and the method iterates back to Process S6-1 to determine the optimal value for that further read reference level. The iteration relating to the read reference levels (indexed by "i" in this example) stops (S6-7, no), when the optimal values R'i of all read reference levels that had been selected for optimization, which may comprise all or only a sub-set of the total set of read reference levels available, have been determined. The resulting optimal set of read reference levels R'0 to R'M is subsequently applied, when the operation mode relating to FIG. 5 (c) is initiated in the course of a respective transition process (cf. process S3-6 in FIGS. 3 and 4 with M=6).

Figure 7:
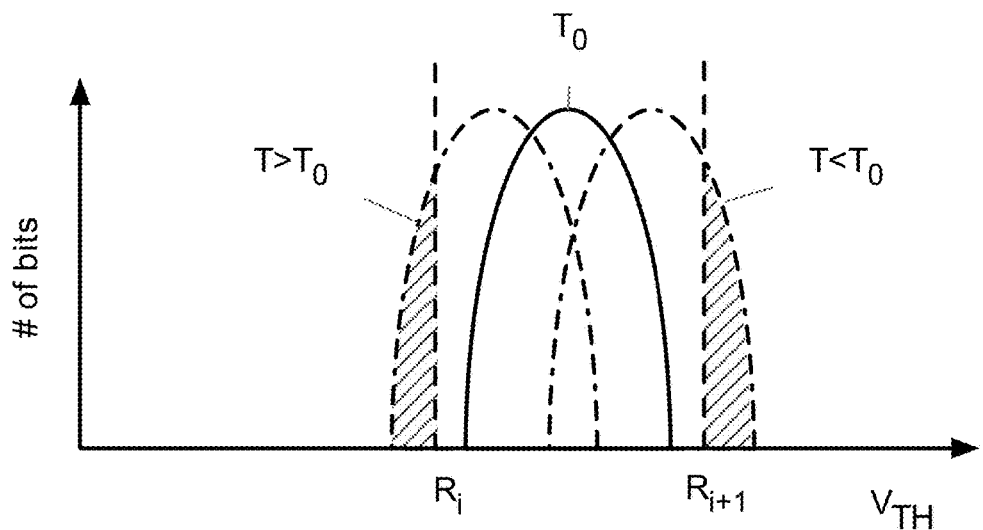
FIG. 7 is an illustration of temperature driven shifts of an exemplary threshold voltage (VTH) distribution of an NVM of the TLC flash memory type.

A related embodiment is now described with reference to FIG. 7, which is an illustration of temperature driven shifts of an exemplary threshold voltage (VTH) distribution of an NVM of the TLC flash memory type. In addition to its dependency on age and the number of occurred P/E cycles etc., as described above, the position of the bit distributions along the VTH axis typically also shows a temperature dependency, as shown in FIG. 7. When the temperature of a flash memory device rises, the average energy of the electrons in the channels of the flash memory cells of the device is also increased. Accordingly, the threshold voltage of VTH is reduced, because due to the increased electron energy a lower voltage level at the floating gate is then sufficient to make the channel conductive. On the other hand, if the temperature is lowered, the opposite effect occurs, such that the thresh-old voltage VTH increases accordingly. This effect is shown in FIG. 7. Thus, starting from a temperature T0, at which the distribution is substantially confined within the respective VTH-range between two neighboring reference levels Ri and Ri+1, a change of temperature may cause a shifting of the distribution such that at least a portion of the distribution falls into a neighboring range, such causing a similar situation as already previously discussed with reference to FIG. 5 (b). In order to address such a situation, the set of read reference levels (e.g. R0 to R6 in the case of TLC flash) may be adjusted as in FIG. 5 (c) such as to minimize the shaded areas, which again corresponds to minimizing BEL. A respective mode of operation may thus be defined so that it involves a respective temperature-dependent repositioning of the read reference levels.

In particular, in a some cases variant, the repositioning of the read reference levels may be triggered, if the temperature difference reaches or extends beyond a predetermined threshold value, which may be a configurable parameter, e.g. configurable via the firmware of the flash controller. Furthermore, if an information characterizing the temperature of the flash device at the time when the page under consideration was last programmed is available to the controller, it may particularly store such information in a spare area not used by the ECC for write operations. When during execution of a read command for that page ECC has been applied, the difference between the current temperature of the flash device and the stored temperature at programming time is compared to the threshold value and if this difference is at or above the chosen threshold, a repositioning of the set of read reference levels for that page, i.e. of at least one and in some cases all of said levels, to compensate for the temperature effect is performed to reduce the BEL.

Now another mode of operation is discussed with reference to FIGS. 5 (a), 8, and 9. TLC flash memory can write up to three different pages (LP, CP, UP) on the same word line and since particularly 3D flash memory devices are much less affected by cell to cell interference, some of them even allow to write these three pages simultaneously. Each of the three pages may use a different number of read references at different levels. This is illustrated in FIG. 5 (a), where two read reference levels R0 and R4 are needed for reading the lower page LP, two read reference levels R2 and R6 are needed to read the center page CP, and three read reference levels R1, R3 and R5 are needed to read the upper page UP. These read reference levels correspond to those threshold voltages VTH where in the respective page a transition from a bit value of "1" to "0", or vice versa, takes place, such that these read reference levels need to be applied in order to properly read the content of the respective page. In FIG. 5 (c), these transition points are each marked by a small filled circle.

Figure 8:
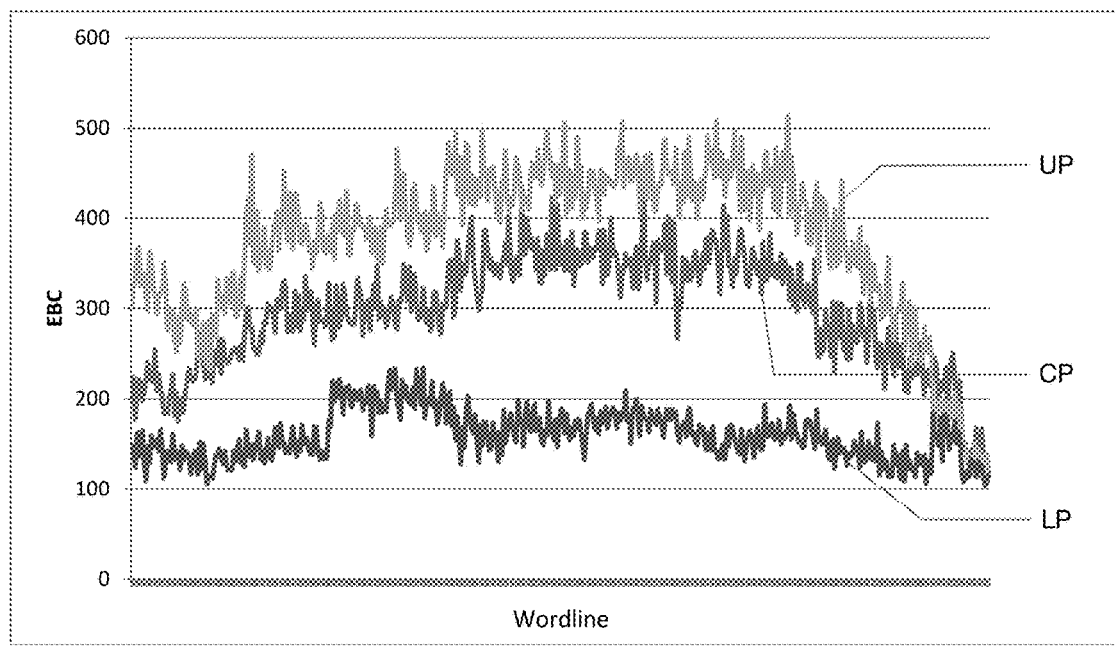
FIG. 8 illustrates exemplary measurement results of EBC across the cells of a common wordline in a NVM of the TLC flash memory type.

Other exemplary implementations may for example use 1, 2 and 4 read reference levels for the three pages LP, CP and UP, respectively. Consequently, the error bits are not spread evenly across the pages. For example, in case only one read reference level is used, the page is read like a single level cell (SLC) page and therefore the BEL, e.g. EBC, on this page will be much lower than it would if the other two pages were used as well. For the mentioned case involving 1, 2 and 4 read levels, FIG. 8 shows exemplary measurement results of EBC across the cells of a common wordline in a NVM of the TLC flash memory type with 16 KB pages and at the EOL point. Clearly, the upper page UP has a significantly higher BEL than the center page CP, whose BEL in turn is significantly higher than that of the lower page LP.

Figures 9, 10:
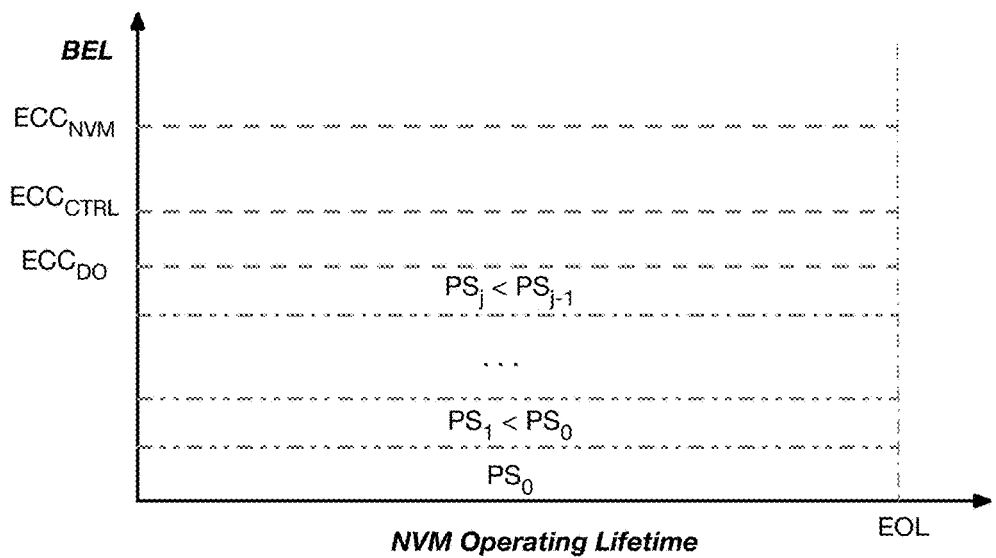
FIG. 9 is a scheme illustrating an embodiment of the method of FIGS. 2A, 2B wherein codewords to be programmed into the NVM are divided into sections and the sections are spread over multiple different pages of a same memory portion, such as the cells of a common wordline in a n-level flash memory with n>1.
FIG. 10 is a scheme illustrating another embodiment of the methods of FIGS. 2A, 2B, wherein a zoned approach is used to adjust an NVM parameter, such a programming speed, in dependence of a current BEL.

In the case that two or more of the pages may be written simultaneously, this issue may be addressed as illustrated in FIG. 9, according to which the information contained in each codeword may be spread across these two or more pages to average out the BEL related to that codeword. In FIG. 9, the upper table corresponds to the data to be stored into the TLC flash memory, wherein the top row corresponds to the upper page, UP, the second row to the center page, CP, and the third row, to the lower page, LP. In this example, each page is 16 KB long and each codeword (CW) has a length of 1 KB. Accordingly, each row has 16 columns, each column representing one codeword. For example, the table cell in second column and in the second row of the table is labeled "CWCP1", and refers to the 2nd codeword (index 1) of the center page CP.

For storing this table into the flash memory, each of the codewords is split into three segments and then the position of these segments within the resulting lower table of FIG. 9, where the columns now refer to segments rather than whole codewords, is rearranged in such a way, that the content of each original codeword is now spread across all three pages. For example, codeword CWCP1 has been split into three segments CWCP1,2, CWCP1,1 and CWCP1,0, which now form the fifth column in the lower table of FIG. 9 and are thus spread across all three pages UP, CP and LP. In this way, the error bits will be spread evenly among the pages which allows for a significant reduction of the BEL (e.g. EBC), particularly a significant reduction of the maximum EBC for those codewords showing the highest BEL among the codewords.

In the example of FIG. 9, it is a requirement that all three pages must be read before ECC decoding can be applied, which thus may slow down the achievable read performance. To reduce such impact on read performance, in one variant the controller may initiate this mode of operation only in one of the later iterations, i.e. not at point A1 of FIG. 2A or 2B, but instead only later at one of points A2, A3 or A4. Particularly, information indicating which of the two coding methods, i.e. according to the upper table of FIG. 9 or the lower table of FIG. 9 in the above example, is to be applied for specific page may be stored in the memory spare area that is not used by ECC. If a decoding error occurs, in a further variant, first both different decoding methods could be tried, before declaring a decoding failure.

In case of a TLC flash device that does not allow to program all three pages simultaneously, but instead allows for doing so in two passes, the same approach can be applied to those two pages that may be programmed simultaneously, although the achieved BEL reduction will be typically lower than in the case where simultaneous programming of all three pages is possible. For example, some 3D TLC flashes allow to program LP in the first pass and the combination of CP and UP in the second pass.

In the case of simultaneous writing of all three TLC pages the above-mentioned impact on read performance may be reduced by using different ECC levels for the pages on the same wordline. This approach is available for controllers having multiple ECC modes. For example, in case of a page of 18,336 KB, each 1 KB codeword would allow only less then 70b of ECC using a flash-typical BCH code. With such amount of spare area available, it would particularly be possible to implement the following levels of ECC for the different pages: LP: 40b/1 KB; CP: 60b/1 KB; UP: 96b/1 KB. The additional parity bits for the UP page, which do not fit in the available spare area, may be stored in the unused spare area of the LP. The advantage of this method is that LP and CP pages can be read with one read operation and only the UP page requires two read operations (UP and LP) before ECC can be applied.

According to another method of optimization, an exemplary embodiment of which is illustrated in FIG. 10, a respective mode of operation may involve modifying one or more parameters of the NVM in such a way that the number of error bits is reduced. Particularly, this may be achieved by accessing a test mode of the NVM device that allows for modifying such parameters.

For instance, reducing the programming speed of the NVM as a parameter, allows for a better control of the distribution width (and so lower error bit count), however at the cost of a lower programming throughput. Specifically, the programming speed PS may be reduced by lowering the incremental rate of the programming voltages applied. Particularly, a mode of operation involving a reduction of the programming speed of the NVM, e.g. flash, may be initiated when the BEL reaches a predetermined one of points A1 to A4 of FIG. 2A or 2B, respectively, as determined during reading the memory page. Instead or in addition, after every programming of the memory page, a verification (read) including calculating the BEL, e.g. in terms of EBC, may be performed, and if according to the verification result, the BEL has reached or exceeds a corresponding predetermined threshold, this information can be stored in the management data of the memory page and trigger a transition to a different mode of operation for the next programming of this memory page, such as a mode involving a reduction of the programming speed of the NVM.

Furthermore, in one implementation, the domain of operation DO may be divided into two or more sub-domains corresponding to different BEL ranges, wherein each of these sub-domains corresponds to a different setting of one or more of the operating parameters of the NVM. Specifically, in one example, each sub-domain may correspond to a different programming speed PS, as illustrated in FIG. 10. Thus, the parameter PS is set as a function of the current BEL, starting at a high, and in some cases the highest programming speed level PS0, and the process wise to further levels PS1, PS2, etc. with consecutively reduced programming speeds until BEL reaches ECCDO. The same approach may be used for other NVM parameters, in particular in the case of flash memory to: a programming voltage, a read voltage, an erase voltage, an erase speed, one or more programming reference levels, a threshold voltage distribution across the cells of said memory portion.

Each of the modes of operation of the NVM may be defined such that it involves one or more of the methods of optimization described herein, to the extent applicable for the respective type of NVM.

While above at least one exemplary embodiment of the present invention has been described, it has to be noted that a great number of variations thereto exist. Furthermore, it is appreciated that the described exemplary embodiments only illustrate non-limiting examples of how the present invention can be implemented and that it is not intended to limit the scope, the application or the configuration of the herein-described apparatus' and methods. Rather, the preceding description will provide the person skilled in the art with constructions for implementing at least one exemplary embodiment of the invention, wherein it has to be understood that various changes of functionality and the arrangement of the elements of the exemplary embodiment can be made, without deviating from the subject-matter defined by the appended claims and their legal equivalents.

LIST OF REFERENCE SIGNS

1 memory system
2 memory controller
2a processing unit
2b embedded memory of memory controller
3 nonvolatile memory, particularly flash memory
4 host
AL address line(s)
DL data line(s)
CL control line(s)
AB address bus
DB data bus
CB control bus
BEL Bit Error Level, e.g. expressed as EBC
EBC Error Bit count
$ECC_{NVM}$ Error correction coding (ECC) requirement of NVM
$ECC_{CTRL}$ ECC capability of NVM controller
$ECC_{DO}$ upper limit of domain of operation (DO)
$A_1, \ldots, A_4$ Trigger points for optimization and next iteration
$B_1, \ldots, B_4$ Starting points of iterations
$C_1$ Optional endpoint of final iteration
$C_2$ Mandatory endpoint of final iteration
$R_0, \ldots, R_6$ Initial Read reference levels
$R'_0, \ldots, R'_6$ Adjusted Read reference levels
UP Upper page in TLC flash memory
CP Central page in TLC flash memory
LP Lower page in TLC flash memory
$V_{TH}$ Threshold Voltage of flash memory cell
T Current Temperature of flash memory
$T_0$ Initial Temperature of flash memory
CW Codeword
PS Programming Speed

What is claimed is:

1. Method of enhancing the reliability of a non-volatile memory (NVM) under control of a corresponding NVM controller having a predefined error correction coding (ECC) capability (ECCCTRL) being lower than or equal to the ECC requirement (ECCNVM) of the NVM and using memory pages for storing data to the NVM, the method comprising:
in a monitoring process, wherein the controller determines while applying a current mode of operation to a physical memory portion of the NVM corresponding to a specific memory page, whether a current operating condition of said physical memory portion is consistent with a corresponding predefined domain of operation in which the ECC capability of the controller matches or exceeds an actual bit error level (BEL) of said physical memory portion; and
in a transitioning process, the transitioning process including:
where according to the determination made in the monitoring process the current operating condition of said physical memory portion has reached or passed a limit of said domain of operation, the controller transitions the NVM and/or itself at memory page level and with respect to operating said physical memory portion from the current mode of operation to a subsequent other mode of operation that involves a lower bit error level of the physical memory portion and/or a higher ECC capability of the controller than the current mode of operation; and
otherwise, where according to the determination made in the monitoring process the current operating condition of said physical memory portion has not reached or passed a limit of said domain of operation, continuing to apply the current mode of operation with respect to said physical memory portion.

2. The method of claim 1, the method further comprising:
iteratively performing the monitoring process and the transitioning process until a predefined termination criterion is met.

3. The method of claim 2, wherein the predefined termination criterion is defined based on at least one of the following:
the number of previous transition processes;
the availability of another subsequent mode of operation that involves a lower bit error level of the physical memory portion and/or a higher ECC capability of the controller than the current mode of operation;
the number of program/erase cycles that have been previously been performed on said physical memory portion.

4. The method of claim 1, wherein the domain of operation is defined such that for any operating condition of said physical memory portion falling within the domain the ECC capability (ECCCTRL) of the controller exceeds the corresponding actual bit error level, BEL, of said physical memory portion by at least a predetermined corresponding distance.

5. The method of claim 1, wherein the ECC capability of the controller and said domain of operation are each defined based on the number of error bits in a codeword of said ECC that can be corrected when ECC-decoding said codeword.

6. The method of claim 1, wherein for ECC-decoding a codeword read from said physical memory portion, the current mode of operation of the controller applies a hard-decoding scheme, while the other mode of operation entered during the transition process applies a soft-decoding scheme based on reliability information about each bit of the codeword instead of or in addition to the hard-decoding scheme.

7. The method of claim 6, the method further comprising:
initializing the soft-decoding scheme by per-forming a set of multiple reads of said physical memory portion at different predetermined read reference levels to derive reliability data for each of the bits of the physical memory portion and storing this reliability data for subsequent use by the soft decoding scheme.

8. The method of claim 1, wherein the NVM is a flash memory of the m-level cell type, wherein m is a positive integer greater than 1, and the NVM supports simultaneous programming of k pages corresponding to said memory portion, with $1<k\leq m$, and the controller is a flash controller.

9. The method of claim 8, wherein the NVM is a 3D-flash memory type.

10. The method of claim 8, wherein:
the other mode of operation to be entered during the transition process involves for reading codewords from respective different pages of said physical memory portion, applying a set of read reference levels that differs with respect to at least one of said read reference levels from a corresponding set of read reference levels applied in the current mode of operation for reading codewords from the different pages of said memory portion; and the transition process comprises repositioning said at least one read reference level such that the other mode of operation reduces the actual bit error level of the physical memory portion relative to the current mode of operation.

11. The method of claim 10, wherein the domain of operation is defined by means of a threshold for a corresponding bit error level, BEL, of said physical memory portion or a variable depending on BEL, one or more temperature thresholds for a temperature of said NVM, or a combination thereof.

12. The method of claim 8, wherein the other mode of operation to be entered during the transition process involves for simultaneously programming two or more codewords in respective different pages of said physical memory portion, dividing each of the codewords in two or more sections and rearranging the sections such that for each codeword its different sections are spread across at least two of the pages being programmed.

13. The method of claim 8, wherein:
the other mode of operation to be entered during the transition process involves controlling the NVM based on at least one operational parameter of the NVM having a different value than in the current mode; and
the transition process comprises setting the value of said at least one operational parameter to said different value, which is selected such as to reduce the actual bit error level of the physical memory portion when transitioning from the current mode of operation to the other mode of operation.

14. The method of claim 13, wherein at least one modified operational parameter is or affects one or more of the following parameters of the NVM or a combination of at least two thereof:
a programming voltage;
a programming speed;
a read voltage;
an erase voltage;
an erase speed;
one or more programming reference levels;
a threshold voltage distribution across the cells of said physical memory portion.

15. The method of claim 13, wherein:
the domain of operation is divided into two or more distinct sub-domains corresponding to different ranges of reliability of the NVM;
if according to the determination made in the monitoring process the current operating condition of said memory portion falls within said domain of operation, the monitoring process further comprises determining among the sub-domains the specific sub-domain, into which the current operating condition falls; and
said different value of the at least one operational parameter to be modified is determined based on the determination of said specific sub-domain, such that the ex-tent of modification of said value during the transition process corresponds to the range of reliability pertaining to said specific determined sub-domain.

16. The method of claim 8, wherein the other mode of operation to be entered during the transition process involves applying different ECC levels for programming different pages corresponding to said physical memory portion.

17. The method of claim 16, wherein programming a higher-level page comprises storing a subset of the parity bits required for programming the ECC codewords of said higher ECC-level into an unused portion of a spare area allocated to said lower-level page.

18. A non-volatile computer readable medium, the medium comprising:
instructions executable by one or more processors of an NVM controller for controlling a NVM using memory pages, the NVM controller having a predefined error correction coding, ECC, capability (ECCCTRL);
wherein executing the instructions causes the NVM controller to:
perform a monitoring process, wherein the controller determines while applying a current mode of operation to a physical memory portion of the NVM corresponding to a specific memory page, whether a current operating condition of said physical memory portion is consistent with a corresponding predefined domain of operation in which the ECC capability of the controller matches or exceeds an actual bit error level (BEL) of said physical memory portion; and
perform a transitioning process, the transitioning process including:
where according to the determination made in the monitoring process the current operating condition of said physical memory portion has reached or passed a limit of said domain of operation, the controller transitions the NVM and/or itself at memory page level and with respect to operating said physical memory portion from the current mode of operation to a subsequent other mode of operation that involves a lower bit error level of the physical memory portion and/or a higher ECC capability of the controller than the current mode of operation; and
otherwise, where according to the determination made in the monitoring process the current operating condition of said physical memory portion has not reached or passed a limit of said domain of operation, continuing to apply the current mode of operation with respect to said physical memory portion.

19. A non-volatile memory (NVM) controller for controlling a NVM using memory pages, the NVM controller having a predefined error correction coding (ECC) capability (ECCCTRL), the NVM controller configured to:
perform a monitoring process, wherein the controller determines while applying a current mode of operation to a physical memory portion of the NVM corresponding to a specific memory page, whether a current operating condition of said physical memory portion is consistent with a corresponding predefined domain of operation in which the ECC capability of the controller matches or exceeds an actual bit error level (BEL) of said physical memory portion; and
perform a transitioning process, the transitioning process including:
where according to the determination made in the monitoring process the current operating condition of said physical memory portion has reached or passed a limit of said domain of operation, the controller transitions the NVM and/or itself at memory page level and with respect to operating said physical memory portion from the current mode of operation to a subsequent other mode of operation that involves a lower bit error level of the physical memory portion and/or a higher ECC capability of the controller than the current mode of operation; and otherwise, where according to the determination made in the monitoring process the current operating condition of said physical memory portion has not reached or passed a limit of said domain of operation, continuing to apply the current mode of operation with respect to said physical memory portion.

20. The NVM controller of claim 19, wherein the NVM controller includes:
at least one processor; and
a non-transient computer readable medium including instructions executable by the processor to:
perform the monitoring process; and
perform the transitioning process.

21. The NVM controller of claim 19, the controller further configured to:
iteratively perform the monitoring process and the transitioning process until a predefined termination criterion is met.

22. The NVM controller of claim 21, wherein the predefined termination criterion is defined based on at least one of the following:
the number of previous transition processes;
the availability of another subsequent mode of operation that involves a lower bit error level of the memory portion and/or a higher ECC capability of the controller than the current mode of operation;
the number of program/erase cycles that have been previously been performed on said memory portion.

23. The NVM controller of claim 19, wherein the domain of operation is defined such that for any operating condition of said memory portion falling within the domain the ECC capability (ECCCTRL) of the controller exceeds the corresponding actual bit error level, BEL, of said memory portion by at least a predetermined corresponding distance.

24. The NVM controller of claim 19, wherein the ECC capability of the controller and said domain of operation are each defined based on the number of error bits in a codeword of said ECC that can be corrected when ECC-decoding said codeword.

25. The NVM controller of claim 19, wherein for ECC-decoding a codeword read from said physical memory portion, the current mode of operation of the controller applies a hard-decoding scheme, while the other mode of operation entered during the transition process applies a soft-decoding scheme based on reliability information about each bit of the codeword instead of or in addition to the hard-decoding scheme.

26. The NVM controller of claim 25, the NVM controller further configured to:
initialize the soft-decoding scheme by per-forming a set of multiple reads of said physical memory portion at different predetermined read reference levels to derive reliability data for each of the bits of the physical memory portion and storing this reliability data for subsequent use by the soft decoding scheme.

27. The NVM controller of claim 19, wherein the NVM is a flash memory of the m-level cell type, wherein m is a positive integer greater than 1, and the NVM supports simultaneous programming of k pages corresponding to said physical memory portion, with $1<k\leq m$, and the controller is a flash controller.

28. The NVM controller of claim 27, wherein the NVM is a 3D-flash memory type.

29. The NVM controller of claim 27, wherein:
the other mode of operation to be entered during the transition process involves for reading codewords from respective different pages of said physical memory portion, applying a set of read reference levels that differs with respect to at least one of said read reference levels from a corresponding set of read reference levels applied in the current mode of operation for reading codewords from the different pages of said physical memory portion; and
the transition process comprises repositioning said at least one read reference level such that the other mode of operation reduces the actual bit error level of the physical memory portion relative to the current mode of operation.

30. The NVM controller of claim 29, wherein the domain of operation is defined by means of a threshold for a corresponding bit error level, BEL, of said physical memory portion or a variable depending on BEL, one or more temperature thresholds for a temperature of said NVM, or a combination thereof.

31. The NVM controller of claim 27, wherein the other mode of operation to be entered during the transition process involves for simultaneously programming two or more codewords in respective different pages of said physical memory portion, dividing each of the codewords in two or more sections and rearranging the sections such that for each codeword its different sections are spread across at least two of the pages being programmed.

32. The NVM controller of claim 27, wherein:
the other mode of operation to be entered during the transition process involves con-trolling the NVM based on at least one operational parameter of the NVM having a different value than in the current mode; and
the transition process comprises setting the value of said at least one operational parameter to said different value, which is selected such as to reduce the actual bit error level of the physical memory portion when transitioning from the current mode of operation to the other mode of operation.

33. The NVM controller of claim 32, wherein said at least one operational parameter is or affects one or more of the following parameters of the NVM or a combination of at least two thereof:
a programming voltage;
a programming speed;
a read voltage;
an erase voltage;
an erase speed;
one or more programming reference levels;
a threshold voltage distribution across the cells of said physical memory portion.

34. The NVM controller of claim 32, wherein:
the domain of operation is divided into two or more distinct sub-domains corresponding to different ranges of reliability of the NVM;
if according to the determination made in the monitoring process the current operating condition of said memory portion falls within said domain of operation, the monitoring process further comprises determining among the sub-domains the specific sub-domain, into which the current operating condition falls; and
said different value of the at least one operational parameter to be modified is determined based on the determination of said specific sub-domain, such that the ex-tent of modification of said value during the transition process corresponds to the range of reliability pertaining to said specific determined sub-domain.

35. The NVM controller of claim 27, wherein the other mode of operation to be entered during the transition process involves applying different ECC levels for programming different pages corresponding to said physical memory portion.

36. The NVM controller of claim 35, wherein programming a higher-level page comprises storing a subset of the parity bits required for programming the ECC codewords of said higher ECC-level into an unused portion of a spare area allocated to said lower-level page.

37. A memory system, the memory system comprising:
a non-volatile memory (NVM); and
a NVM controller, wherein the NVM controller is configured to:
   perform a monitoring process, wherein the controller determines while applying a current mode of operation to a physical memory portion of the NVM corresponding to a specific memory page, whether a current operating condition of said physical memory portion is consistent with a corresponding predefined domain of operation in which the ECC capability of the controller matches or exceeds an actual bit error level (BEL) of said physical memory portion; and
   perform a transitioning process, the transitioning process including:
      where according to the determination made in the monitoring process the current operating condition of said physical memory portion has reached or passed a limit of said domain of operation, the controller transitions the NVM and/or itself at memory page level and with respect to operating said physical memory portion from the current mode of operation to a subsequent other mode of operation that involves a lower bit error level of the physical memory portion and/or a higher ECC capability of the controller than the current mode of operation; and
      otherwise, where according to the determination made in the monitoring process the current operating condition of said physical memory portion has not reached or passed a limit of said domain of operation, continuing to apply the current mode of operation with respect to said physical memory portion.

38. The memory system of claim 37, wherein the NVM includes at least one 3D-Flash memory device.

* * * * *